United States Patent
Tamma et al.

(10) Patent No.: US 10,991,856 B2
(45) Date of Patent: Apr. 27, 2021

(54) LED WITH STRUCTURED LAYERS AND NANOPHOSPHORS

(71) Applicant: Lumileds LLC, San Jose, CA (US)

(72) Inventors: Venkata Ananth Tamma, San Jose, CA (US); Antonio Lopez-Julia, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/228,522

(22) Filed: Dec. 20, 2018

(65) Prior Publication Data

US 2019/0198728 A1 Jun. 27, 2019

Related U.S. Application Data

(60) Provisional application No. 62/609,085, filed on Dec. 21, 2017, provisional application No. 62/609,520, filed on Dec. 22, 2017.

(30) Foreign Application Priority Data

Mar. 13, 2018 (EP) ..................... 18161535
Mar. 14, 2018 (EP) ..................... 18161807

(51) Int. Cl.
*H01L 33/50* (2010.01)
*H05B 33/14* (2006.01)
*H01L 33/32* (2010.01)
*H01L 33/46* (2010.01)
*H01L 27/15* (2006.01)

(52) U.S. Cl.
CPC .......... *H01L 33/505* (2013.01); *H01L 33/502* (2013.01); *H05B 33/145* (2013.01); *H01L 27/156* (2013.01); *H01L 33/32* (2013.01); *H01L 33/46* (2013.01); *H01L 2933/0091* (2013.01)

(58) Field of Classification Search
None
See application file for complete search history.

(56) References Cited

U.S. PATENT DOCUMENTS

2007/0085100 A1* 4/2007 Diana ................. H01L 33/502
257/98
2008/0185604 A1* 8/2008 Kim ....................... C09K 11/54
257/98
2012/0327502 A1 12/2012 Zheludev et al.
(Continued)

FOREIGN PATENT DOCUMENTS

TW 201417355 A 5/2014
TW 201700714 A 1/2017
(Continued)

OTHER PUBLICATIONS

International Search Report corresponding to PCT/US2018/067148, dated Mar. 26, 2019, 1 page.
(Continued)

*Primary Examiner* — Shaun M Campbell

(57) ABSTRACT

A device comprising a light emitting diode (LED) substrate, and a meta-molecule wavelength converting layer positioned within an emitted light path from the LED substrate, the a meta-molecule wavelength converting layer including a plurality of nanoparticles, the plurality of nanoparticles configured to increase a light path length in the wavelength converting layer.

20 Claims, 8 Drawing Sheets

(56) References Cited

U.S. PATENT DOCUMENTS

| | | | |
|---|---|---|---|
| 2014/0153216 A1* | 6/2014 | Yamanaka | F21V 5/04 362/84 |
| 2014/0226335 A1* | 8/2014 | Menkara | C09K 11/02 362/259 |
| 2015/0001464 A1* | 1/2015 | Fukuura | C09K 11/025 257/13 |
| 2016/0190403 A1* | 6/2016 | Verschuuren | H01L 33/504 257/98 |
| 2016/0300981 A1* | 10/2016 | Woo | H01L 33/002 |
| 2016/0369975 A1* | 12/2016 | Chen | C09K 11/883 |
| 2017/0017886 A1 | 1/2017 | Gao et al. | |
| 2017/0192129 A1* | 7/2017 | Cunningham | C09K 11/025 |
| 2017/0207370 A1* | 7/2017 | Koole | H01L 33/502 |
| 2017/0271562 A1 | 9/2017 | Wang et al. | |
| 2019/0241805 A1* | 8/2019 | Ando | C09K 11/883 |

FOREIGN PATENT DOCUMENTS

| | | |
|---|---|---|
| WO | 2015/019229 | 2/2015 |
| WO | 2015/162003 | 10/2015 |

OTHER PUBLICATIONS

Cicek et al., "Structural tuning of color chromaticity through nonradiative energy transfer by interspacing CdTe nanocrystal monolayers", Applied Physics Letters 94, No. 6, Feb. 9, 2009, 3 pages.

Kuzyk, et al., "Reconfiguralble 3D plasmonic metamolecules," Nature Materials 13, 862-866 (2014).

Shafiei, Etal., "A subwavelength plasmonic metamolecule exhibiting magnetic based optical Fano resonance," Nature Nanotechnology 8, 95-99 (2013).

Office of Energy Efficiency and Renewable Energy, "Phosphortech Develops Plasmonics-Enhanced High-Light-Extraction Phosphor Sheets for Led Lighting," Available at: https://web.archive.org/web/20170730091308/https://www.energy.gov/eere/ssl/phosphortech-develops-plasmonics-enhanced-high-light-extraction-phosphor-sheets-led (Jul. 30, 2017).

Office of Energy Efficiency and Renewable Energy, "Plasmonic-Enhanced High Light Extraction Phosphor Sheets for Solid-State Lighting," Available at: https://web.archive.org/web/20170615132508/https://www.energy.gov/eere/buildings/downloads/plasmonic-enhanced-high-light-extraction-phosphor-sheets-solid-state (Jun. 15, 2017).

SBIR—STTR, "Plasmonic-enhanced High Light Extraction Phosphor Sheets for Solid State Lighting," Available at: https://web.archive.org/web/20170429182519/https://www.sbir.gov/sbirsearch/detail/831909 (Apr. 29, 2017).

Phosphortech, "Phosphor Sheets," Available at: https://phosphortech.com/products/phosphor-sheets/ (2018).

Hussain et al., "Enabling low amounts of YAG:Ce3+ to convert blue into white light with plasmonic Au nanoparticles," Nanoscale, 7,10350, (2015).

Shibanuma et al., "Experimental Demonstration of Tunable Directional Scattering of Visible Light from All-Dielectric Asymmetric Dimers," ACS Photonics, 4 (3), pp. 489-494 (2017).

Li et al., "All-Dielectric Antenna Wavelength Router with Bidirectional Scattering of Visible Light," Nano Lett., 16 (7), pp. 4396-4403 (2016).

Staude et al. "Tailoring Directional Scattering through Magnetic and Electric Resonances in Subwavelength Silicon Nanodisks," ACS Nano, 7 (9), pp. 7824-7832 (2013).

Vercruysse et al., "Unidirectional Side Scattering of Light by a Single-Element Nanoantenna," Nano Lett., 13 (8), pp. 3843-3849 (2013).

Smalley et al., "Luminescent hyperbolic metasurfaces," Nature Communications, 8, Article No. 13793 (2017).

Galfsky et al. "Photonic hypercrystals for control of light-matter interactions," PNAS, vol. 114, No. 20, 5125-5129 (2017).

Tamma et al., "Scattering reduction at near-infrared frequencies using plasmonic nanostructures," vol. 21, No. 1, Optics Express, (2013).

The International Search Report and Written Opinion of the EPO as the International Searching Authority, PCTUS2018067148, dated Mar. 26, 2019, 14 pages.

Ozel et al., "Plasmon enhanced colloidal nanocrystal composites incorporating Au nanoparticles in a repeating layered architecture", LEOS 2009—22nd Annual Meeting of the IEEE Lasers and Electro-Optics Society. LEO 2009 Oct. 4-8, 2009; Belek Antalya, Turkey, IEEE, Piscataway, NJ, USA, Oct. 4, 2009, pp. 634-635.

Zhukovsky et al., "Hyperbolic metamaterials based on quantum-dot plasmon resonator nanocomposites", Optics Express, vol. 22, No. 15, Jul. 28, 2014, pp. 18290-18298.

Ozel et al., "Anisotropic Emission from Multilayered Plasmon Resonator Nanocomposites of Isotropic Semiconductor Quantum Dots", ACS Nano, vol. 5, No. 2, Feb. 22, 2011, pp. 1328-1334.

The extended European Search Report corresponding to EP18161535.2 dated Sep. 13, 2018, 8 pages.

The extended European Search Report corresponding to EP18161807.5 dated Sep. 20, 2018, 8 pages.

* cited by examiner

70

71 → Provide power to an LED to cause emitted light

72 → Interact with the light via a meta-molecule layer to:

73 → Increase the absorption of the blue pump light

74 → Increase the local photonic density of states to increase down-converted light 75 → Control the angular emission pattern of the emitted light into the optical far-field 76 → Provide beamforming to direct the emitted light

FIG. 1E

LED WITH STRUCTURED LAYERS AND NANOPHOSPHORS

CROSS REFERENCE TO RELATED APPLICATIONS

This application claims the benefit of U.S. Provisional Application No. 62/609,085 filed Dec. 21, 2017, U.S. Provisional Application No. 62/609,520 filed Dec. 22, 2017, European Patent Application No. 18161535.2 filed Mar. 13, 2018, and European Patent Application No. 18161807.5 filed Mar. 14, 2018, which are incorporated by reference as if fully set forth.

BACKGROUND

The present invention relates to light emitting diodes (LEDs), and more particularly, to LEDs with structured layers and nanophosphors. A typical phosphor converted, white LED uses phosphor converters to down-convert part of the blue pump light into other colors, such as green, orange, and red. Typically, the phosphor converters are either phosphor particles in a powder form embedded in polymer films or phosphor particles embedded in solid media, such as a ceramics or glass. In either configuration, the phosphor converters are deposited on top of the blue pump LED die. The phosphor converters often include crystals, such as YAG doped with cerium, erbium, and other trivalent lanthanides, and more recently, quantum dots.

The use of powdered phosphor particles embedded in polymer films or in solid media presents challenges. First, absorption cross-sections of the phosphor particles are low and therefore require a large number of phosphor particles to achieve the required converted light intensity and color point. These phosphor particles require a large number of volume scattering agents to improve scattering. Additionally, the phosphor particles can back-scatter significant amount of blue pump light back into the LED die. This back-scattered light is absorbed within the die leading to reduction in efficiency of the LED. Also, the light originating from typical phosphor particles has a Lambertian angular spectrum mainly due to large light scattering within the films. Such an angular spectrum is not a useful feature in applications requiring directed or collimated light emission.

SUMMARY

A device comprising a light emitting diode (LED) substrate, and a meta-molecule wavelength converting layer positioned within an emitted light path from the LED substrate, the a meta-molecule wavelength converting layer including a plurality of nanoparticles, the plurality of nanoparticles configured to increase a light path length in the wavelength converting layer.

A device comprising a light emitting diode (LED) substrate, and a meta-molecule wavelength converting layer positioned within an emitted light path from the LED substrate, the a meta-molecule wavelength converting layer includes a photonic nanostructure, the photonic nanostructure configured to increase a light path length in the wavelength converting layer.

A method comprising providing power to an excitation layer of a light emitting diode (LED) to cause the LED to provide emitted light, and interacting with the emitted light using a meta-molecule wavelength converting layer including at least one of a plurality of nanoparticles or photonic nanostructure to increase a light path length in the meta-molecule wavelength converting layer.

BRIEF DESCRIPTION OF THE DRAWINGS

FIG. 1E illustrates a method of interacting with the light of an LED using a meta-phosphor layer;

DETAILED DESCRIPTION

Figure 1A:
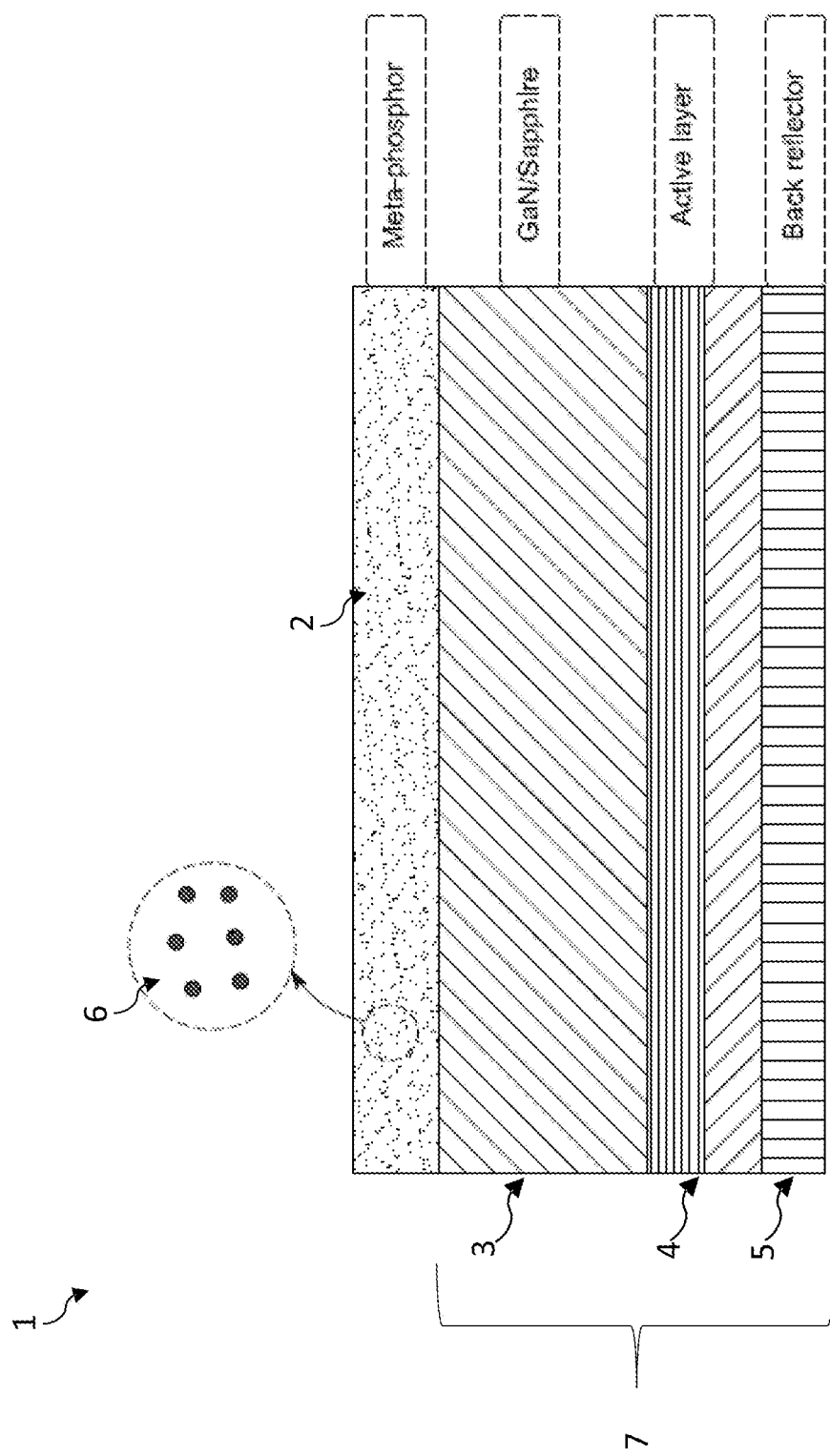
FIG. 1A illustrates a device including a meta-phosphor composed of a meta-molecules embedded in a host dielectric medium on top of a light emitting diode (LED) structure.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures.

It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs" and "LED" in the singular). Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

LEDs with nano-structured phosphors for efficiency improvement, beam-forming and color tuning are disclosed. The nano-structures may be implemented as meta-materials, plasmonic nanostructures, meta-molecules, photonic crystals and the like. The present nano-structured phosphors address the known problems with phosphor converters by incorporating the design of LED devices with optical antennas integrated with converter materials and placed on top of the LED. The converter materials are integrated into artificially structured metal and/or dielectric nanostructures, such that the combined structure (referred to herein as a "meta-molecule" and/or "meta-phosphor"), has unique, tailor-made optical properties. The meta-molecule couples light using the converter particles within it to optical far-fields and adds further functionality to converter materials at least including beam-forming for directional light emission. A meta-phosphor includes phosphor particles embedded in a host nano-structured medium. Application of the described meta-molecule may also improve absorption in phosphor films used in laser based illumination systems, such as those where a laser illuminates a converter film to generate white light.

A device including a meta-molecule layer positioned within an emitted light path from a light emitting diode (LED) substrate, the layer including at least one integrated downconverter including a plurality of nanoparticles, the downconverter being configured to increase the absorption of the blue pump light by increasing scattering in a converter layer, increase the local photonic density of states to increase interaction of the layer with photons to increase down converted light, interact with the emitted light to control the angular emission pattern of the emitted light into an optical far-field, or provide beamforming to direct the emitted light.

A device including a meta-molecule layer positioned within an emitted light path from an LED substrate, the layer including at least one integrated downconverter including a photonic nanostructure, the downconverter being configured to increase the absorption of the blue pump light by increasing scattering in a converter layer, increase the local photonic density of states to increase interaction of the layer with photons to increase down converted light, interact with the emitted light to control the angular emission pattern of the emitted light into an optical far-field, or provide beamforming to direct the emitted light.

FIG. 1 illustrates a device 1 including a meta-phosphor layer 2 composed of a meta-molecules 6 embedded in a host dielectric medium on top of an LED structure 7. The device 1 includes a layer 2 of meta-phosphor materials 6. This layer 2 may be coupled directly to the LED structure 7 and/or may be placed directly on top of the LED structure 7, such as within the emission of the LED. The LED structure 7 may include an LED surface 3 of a gallium nitride (GaN) or sapphire layer, an active layer 4 and a back reflector 5 arranged in an LED stack structure. The LED structure 7 is presented in a simplified form for ease of understanding of the invention, knowing that one possessing an ordinary skill in the pertinent arts would understand the other elements included within an LED.

The gallium nitride (GaN) or sapphire layer is the semiconductor layer, or cavity, and may take the form of a layer of pGaN. As would be understood by those possessing an ordinary skill the pertinent arts, GaN is a binary III/V direct bandgap semiconductor commonly used in light-emitting diodes. GaN has a crystal structure with a wide band gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN as is used in the present example. The active layer 4 is the region where light is emitted as electroluminescence occurs.

The back reflector 5 may take the form of a plasmonic layer including planar metal mirrors, a distributed Bragg reflector (DBR) and/or other known LED reflectors. The back reflector 5 is designed to reflect the omitted light in a useful direction.

The meta-phosphor 6 includes phosphor converter materials (also referred to as "wavelength converting material") incorporated with optical antennas, or scattering elements referred to as a meta-molecule and nanoparticle. The optical antennas can be implemented as an array of nanoparticles (also can be referred to as nano-particles) located on the surface of an LED or distributed in the host dielectric medium. The optical antennas may be arranged in either periodic or a-periodic patterns. The meta-phosphor 6 is made up of meta-molecules embedded in a host dielectric medium. In analogy with chemical molecules composed of atoms, the meta-molecule is composed of meta-atoms with the meta-atoms combined together and interacting to give the meta-molecule 6 unique optical properties of the meta-molecule 6. The size of an individual meta-molecule 6 may be sub-wavelength or may be formed at the same order of wavelength of use. The meta-phosphor layer 2 may be made up of only one type of meta-molecule 6 or may be a mixture of different types of meta-molecules 6. The meta-phosphor 6 may include periodic or aperiodic meta-molecules 6.

A meta-molecule 6 may include a single or multiple downconverter nanoparticles, such as a phosphor nanoparticle, quantum dot (QD), or an aggregate of QDs where the QDs are passivated and protected, a plurality of metallic nanoparticles that support a surface plasmon resonance in a certain frequency band of interest, dielectric materials, such as silicon, silicon dioxide, titanium dioxide, aluminum dioxide, and the like, nanoparticles and nanowires of compound semiconductors, and layers of converter materials deposited on surfaces of the LED. The plurality of metallic nanoparticles may be formed using metals, such as noble metals like gold, silver, etc. or aluminum, and the like.

The meta-molecule 6 is configured such that an absorption peak in the optical absorption spectra of the meta-molecule 6 is designed to overlap with the optical absorption peak of the converter meta-atom. The meta-molecule 6 is designed such that the absorption of pump photons by the converter material is increased, photonic density of states experienced by the converter material is increased, and the emission of light is controlled to certain angular ranges. This increase provides an increased amount of blue pump light absorbed leading to increased light output from the converter material, which leads to a reduction in amount of converter material used in the LED, simplification in manufacture of LEDs with converters, and an improvement in color point of the light emitted from LED device. The increase in the absorption of the meta-molecule 6 also provides an increase in the local photonic density of states experienced by the converter materials. This increase in the photonic density of states increases the interaction of the converter material with photons. This leads to an increase in downconverted light emitted from the converter materials, via the Purcell effect, for example.

The electromagnetic, both optical electric and magnetic, fields inside the meta-molecule 6 is designed to be enhanced at the absorption peak of the meta-molecule 6, which, as described, overlaps with the absorption peak of the converter. The meta-molecule 6 may be designed with the converter meta-atoms spatially overlapped with the regions of high electromagnetic field enhancement. This increases the pump light absorption by the converter meta-atoms leading to an increase of the local photonic density of states and an increase in down-converted light emitted, as described above.

The meta-phosphor 6 can also include optical antennae, or nanostructures that are distributed throughout a host dielectric medium or placed at the interface between the host medium and LED exit surface. The host dielectric medium also includes converter material, such as phosphors, QD, etc. The size of the converter material can be either subwavelength of much larger than wavelength. The sizes of the nano-structures are sub-wavelength or order of wavelength. These nano-structures serve to scatter blue pump light at the absorption peak of the converter material thereby increasing interaction between blue pump light and converter material resulting in improved color conversion efficiency and color mixing. These nano-structures can be designed to scatter light in all directions or in specific chosen directions.

The meta-phosphor 6 is designed so that its optical properties have a resonance or controllable emission properties at a wavelength that overlaps with the emission peak of the converter meta-atom. As a result, the meta-phosphor 6 behaves as an optical antenna and may radiate the light emitted by the converters into free space such that it satisfies certain emission conditions. This is achieved by tuning the structure and chemical composition of the scattering meta-atoms so as to simultaneously excite electric and magnetic dipoles, quadrupoles and higher order multipoles within the structure. The simultaneous excitation of the dipoles and higher order multipoles tailor the emission properties of the meta-phosphor 6.

Tailoring of the emission properties of the meta-phosphor 6 enables control of the angular emission pattern (or directivity) of the light emitted by the converter material by coupling the converter material to optical antennas. Since the meta-phosphor 6 functions as an optical antenna, the directivity of the emitted light may be tuned by tuning the properties of the meta-phosphor. The meta-phosphor 6 may be designed to provide collimated light emission from the LED at multiple wavelengths, beam-forming of light emitted by meta-phosphors 6 for different wavelengths, control of the polarization state of light emitted by meta-phosphors 6 for different wavelengths, and tuning of color-over-angle properties of the LED device via spatial location of meta-phosphors emitting light at particular angles.

The tailoring of the emission properties of the meta-phosphor 6 further enables suppression of back-scattering of blue pump light by the phosphor materials based on the meta-phosphor 6. This suppression reduces pump photons sent back to the LED die which are absorbed in the semiconducting layers and the metal back-contact region of the LED. This suppression of back-scattered pump photons may improve the overall LED efficiency.

The simultaneous excitation of electric and magnetic dipoles within meta-phosphor 6 is sufficient to suppress back-scattering of pump photons back into LED die. Such a meta-phosphor 6 may be built using purely dielectric nanoparticles, without using metals, thereby reducing absorption losses. Suppression of back-scatter from phosphor may also be achieved by effectively 'cloaking by scattering cancellation' the converter meta-atom. At a particular wavelength the net volumetric polarizability of the meta-molecule may be engineered to be zero or close to zero. In this way, the meta-phosphor 6 effectively cancels its scattering profile while still absorbing blue pump photons. This approach may be particularly applicable, for example, in the embodiments described below with respect to FIG. 1B. Such an approach may use plasmonic meta-atoms to increase absorption losses within the meta-phosphor 6.

The effective absorption cross-section of the converter meta-atoms may be increased by allowing for scattering of only blue photons within the converter. This may be designed, for example, in the embodiment described below with respect to FIG. 1B. The scattering meta-atoms may be designed to provide additional scatter in the blue wavelength region and less scatter in the red/orange/yellow/green spectral region. This allows for larger number of blue pump photons to be scattered into the converter increasing its effective absorption cross-section. The scattering of other colored photons into the converter may be reduced. As set forth previously, the meta-phosphor 6 can also include optical antennae, or nanostructures that are distributed throughout a host dielectric medium or placed at the interface between the host medium and LED exit surface. The host dielectric medium also includes converter material such as phosphors, QD etc. The size of the converter material can be either subwavelength or much larger than wavelength. The sizes of the nano-structures are sub-wavelength of order of wavelength. These nano-structures serve to scatter blue pump light at the absorption peak of the converter material thereby increasing interaction between blue pump light and converter material resulting in improved color conversion efficiency and color mixing. These nano-structures can be designed to scatter light in all directions or in specific chosen directions.

The meta-phosphor 6 may be purely plasmonic, composed of metal nanoparticles, or metallo-dielectric, composed of metals and dielectric nanoparticles, or purely dielectric, composed of dielectric nanoparticles, typically high index dielectrics. The meta-phosphor 6 may be fabricated using top-down or bottom-up fabrication methods and may utilize nanoparticle self-assembly to provide advantages for manufacturing and scalability. The meta-atoms may include, but are not limited to, nanoparticles of different shapes and sizes, or layers of converter materials of different thickness. The meta-atoms within the meta-phosphor may be held together by different techniques including, but not limited to, molecular linkers, DNA, and the like. Alternatively, the meta-phosphor 6 may be fabricated by top-down fabrication techniques, such as nano-imprint lithography, nano-sphere lithography, or the like, and individual meta-molecules released using lift-off techniques. The entire meta-molecule 6 may be encapsulated by dielectrics such as silicon dioxide or aluminum dioxide to prevent degradation of meta-molecule properties over time. The meta-phosphors 6 may also be fabricated as a layered material on top of the LED surface, such as on top of the GaN layer or on top of sapphire layer, using top-down fabrication techniques.

Figure 1B:
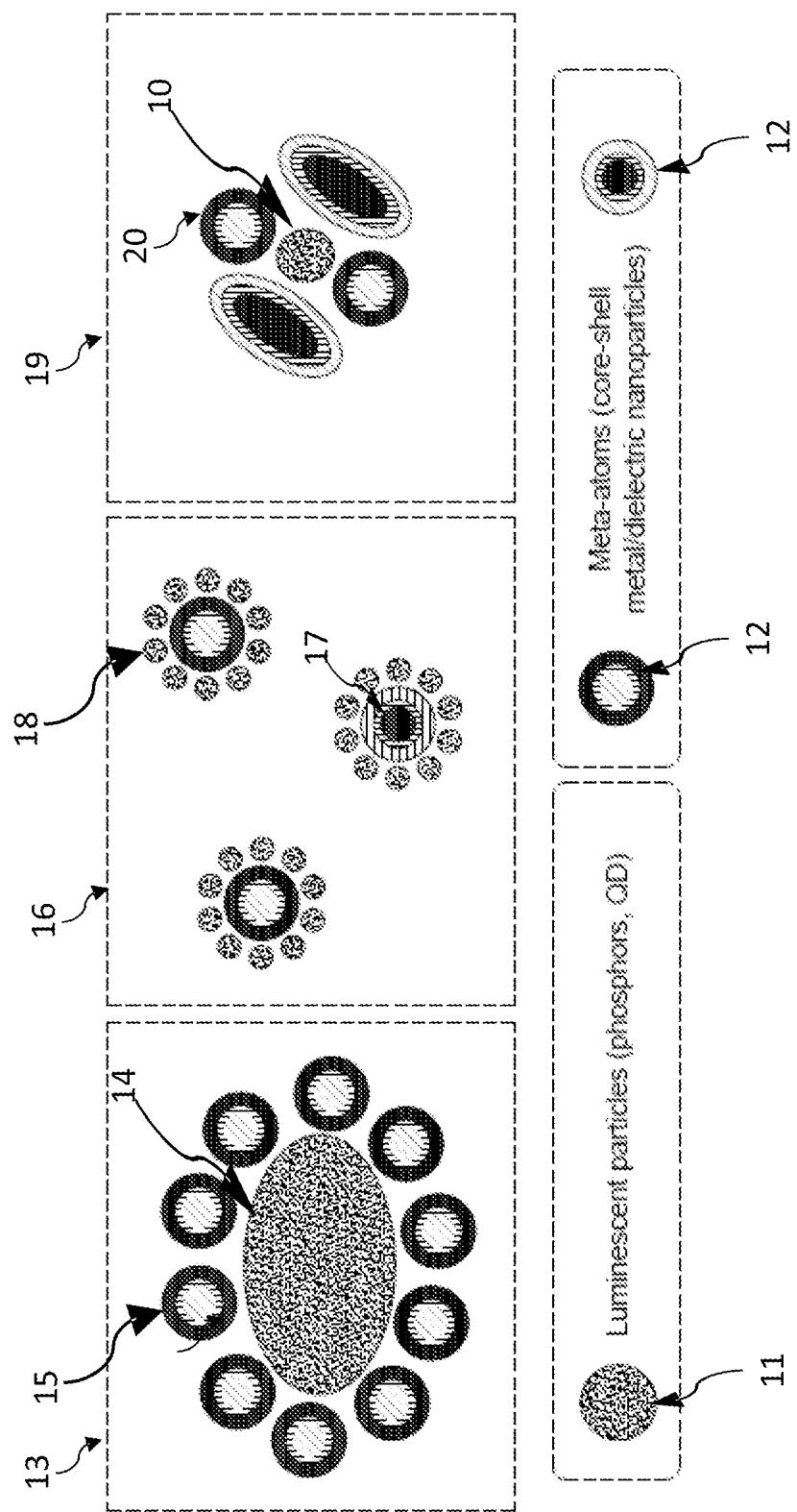
FIG. 1B illustrates configurations of the meta-molecule of FIG. 1A including exemplary combinations of metal/dielectric structures and converter particles.

FIG. 1B illustrates configurations of the meta-molecule 6 including exemplary combinations of metal/dielectric structures and converter particles. The meta-molecules may be implemented as single nanoparticles 11 of different shapes using purely metallic or purely dielectric. The meta-molecules may be implemented as core-shell nanoparticles 12 of different shapes. These particles 12 may include a metal/dielectric core and different dielectric/metal shells surrounding the core. Core-shell nanoparticles 12 with different ordering of layers and materials may be part of the same meta-molecule. The optical properties of the nanoparticles may be tuned by shape, size and chemical composition. Each individual nanoparticle is sub-wavelength in size and may be chemically passivated as required by application. The converter particles may be quantum dots in self-assembled meta-molecules, quantum wells in hyperbolic meta-materials, or doped phosphor nanocrystals.

The meta-molecule 6 may be implemented as a luminescent/converter particle core 14 surrounded by a number of smaller sized meta-atoms. This includes meta-atoms with the same physical and optical properties, and also the possibility of meta-atoms being different from others in physical and optical properties as shown in FIG. 1B depiction 13.

FIG. 1B depiction 13 illustrates a phosphor core 14 with nanoparticles 15 surrounding the core 14. The nanoparticles 15 may include a single particle or core/shell configuration, such as with a silica core and a gold shell, for example.

In the implementation depicted in depiction 13, by making suitable choices of materials, the meta-molecule 6 may be made transparent/nonscattering to blue pump photons and by selecting the meta-atoms to be strong scatters only at blue, while not scattering strongly at red/orange/yellow/green, as discussed, the blue pump photons may be made to scatter inside the converter nanoparticle to increase its effective absorption cross-section.

As illustrated in depicted in depiction 13, a phosphor core 14, or center, may be used. This phosphor core 14 may be surrounded by single nanoparticles 15. The nanoparticles 15 may be single or a core/shell configuration, such as silica core with gold shell, for example. The design may maintain no electrical conductivity between the nanoparticles and the phosphor, for example.

In another implementation, meta-atoms 17 are surrounded by smaller sized converter nanoparticles 18 as shown in depiction 16. The converter nanoparticles 18 may surround the meta-atoms in multiple layers. In addition, different types of meta-atoms and converter nanoparticles may be used. Depiction 16 illustrates converter nanoparticles 18, e.g., phosphor, surrounding the meta-atoms 17. Depiction 16 roughly illustrates the inverse of depiction 13.

In depiction 16, there is shown a single or core/shell configuration surrounded by phosphors particles. Again, the core/shell may be single or the core-shell configuration. The core may be silica and the shell may be gold, for example.

In another implementation, a composite meta-molecule composed of multiple meta-atoms 20 and converter nanoparticles 10 may be formed as shown in depiction 19. Each meta-molecule may be composed of different meta-atoms 20 of different shapes, sizes and compositions. In addition, different types of converters may be part of the same meta-molecule. The converter nanoparticles 10 and meta-atoms 20 may have similar sizes. Depiction 19 represents a hybrid implementation between those implementations illustrated in depiction 13 and depiction 16. There may be different shapes, multiple configurations, for example.

In all of the implementations shown in FIG. 1B, different types of meta-atoms, converter nanoparticles and different combinations of meta-atoms and converter nanoparticles may be employed for spectral coverage, color point tuning and angular emission pattern tuning. The particles may be resonance tuned to the associated phosphors. The phosphor particles may be on the order of nanometers, such as single nanometers to tens of nanometers, or even hundreds of nanometers. The three illustrations in depiction 13, depiction 16 and depiction 19 are representative of the types of combinations that may be employed in the present invention.

Figure 1C:
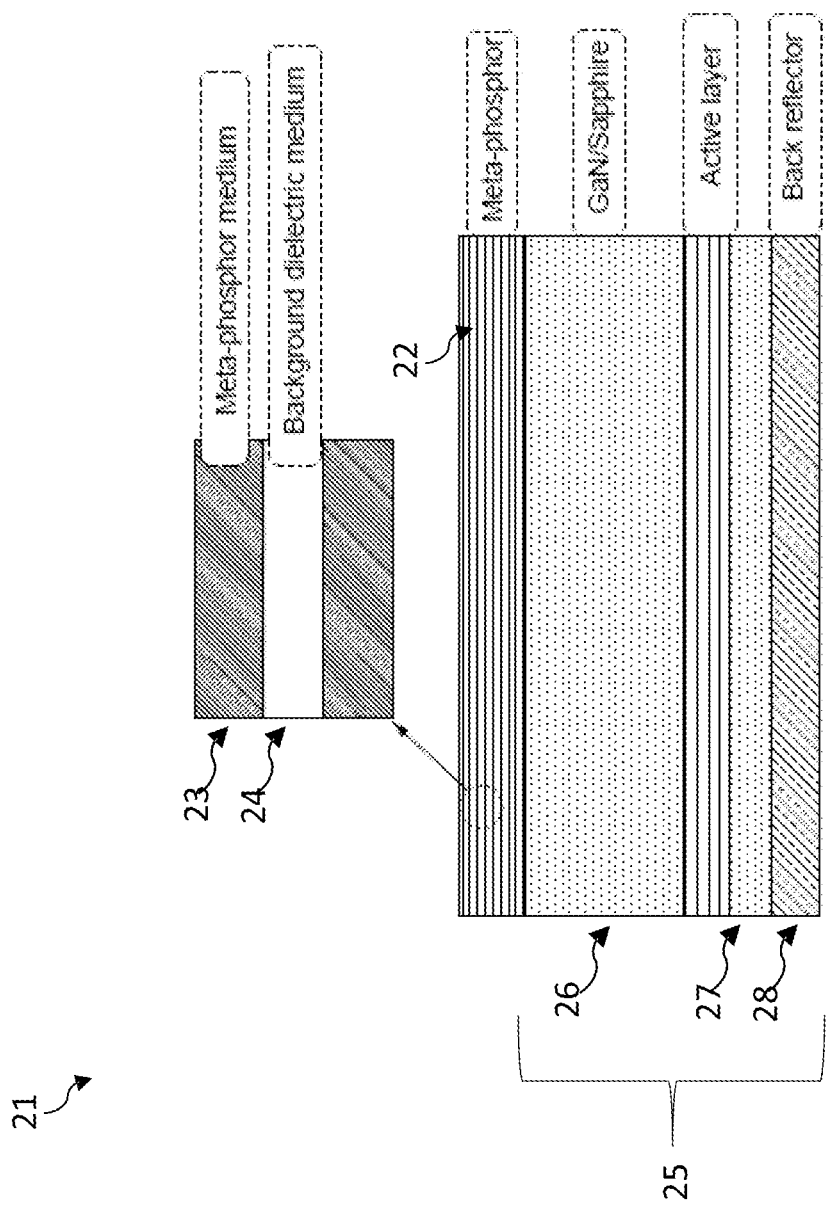
FIG. 1C illustrates a device including a meta-phosphor composed of a meta-molecules embedded in a host dielectric medium on top of an LED structure.

FIG. 1C illustrates a device 21 including a meta-phosphor layer 22 comprising converter particles embedded in layered nano-structures 23 layered with a background dielectric layer 24 on top of an LED structure 25. The device 21 includes the layering of nano-structures 23. This layering may be coupled directly to the top of the LED structure 25. The LED structure 25 may include an LED surface of a gallium nitride (GaN) or sapphire layer 26, an active layer 27 and a back reflector 28 arranged in an LED stack structure. The LED structure 25 is presented in a simplified form for ease of understanding of the invention, knowing that one possessing an ordinary skill in the pertinent arts would understand the other elements included within an LED. Device 21 may operate similarly to device 1 described above.

The gallium nitride (GaN) or sapphire layer 26 is the semiconductor layer, or cavity, and may take the form of a layer of pGaN. As would be understood by those possessing an ordinary skill the pertinent arts, GaN is a binary III/V direct bandgap semiconductor commonly used in light-emitting diodes. GaN has a crystal structure with a wide band gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN as is used in the present example. The semiconductor layer or active layer 27 is the region where light is emitted as electroluminescence occurs.

The back reflector 28 may take the form of a plasmonic layer including planar metal mirrors, a distributed Bragg reflector (DBR) and/or other known LED reflectors. The back reflector 28 is designed to reflect the omitted light in a useful direction.

FIG. 1C illustrates converter nanoparticles (nanospheres, nanowires or quantum wells) embedded within layers 22 of artificially structured photonic nanostructures 23. These photonic nanostructures 23 may take the form of hyperbolic metamaterials (HMM) and Photonic Crystals (PhC). HMM and PhC are typically implemented as layered dielectric media. In PhC configurations, the layers are typically dielectric layers 24 or materials. In HMM configuration, at least one of the layers is a metal layer. The layers may be configured with alternating layers of a background dielectric layer 24, including metals, nanoparticles, HMM, dielectrics, and a layered metamaterial 23, alternating with phosphor layers, for example. Further examples of the phosphor layers include 2D semiconductors for emission, such as doped hexagonal & cubic boron nitride and transition metal dichalcogenides, such as molybdenum di-selenide or molybdenum di-telluride that together with the layered nano-structures create meta-phosphor layers. A nano-structure 23 may include a single or multiple downconverter nanoparticles, such as a phosphor nanoparticle, quantum dot (QD), or an aggregate of QDs where the QDs are passivated and protected.

The nano-structure 23, i.e., meta-phosphor structure is configured such that an absorption peak in the optical excitation spectra of the layered nano-structure is designed to overlap with the optical excitation peak of the converter meta-atom. Alternatively, the nano-structure 23 may consist of phosphor particles such as quantum dots embedded in hyperbolic metamaterials or hyper-crystal media. The quantum dots experience an increase in photonic density of states due to the hyperbolic media thereby increasing the amount of converted light. In addition, nano-patterning of the hyperbolic media including addition of gratings can help with extraction of light from the nano-structure 23. The nano-structure 23 may also consist of phosphor particles such as quantum dots embedded in dielectric photonic crystals. These phosphors interact with various engineered Bragg modes leading to increase in converted light and also directivity of emitted light. This increase provides an increased amount of blue pump light absorbed leading to increased light output from the converter material, which leads to a reduction in amount of converter material used in the LED, simplification in manufacture of LEDs with converters, and an improvement in color point of the light emitted from LED device. The increase in the absorption of the meta-molecule also provides an increase in the local photonic density of states experienced by the converter materials. This increase in the states increases the interaction of the converter material with photons. This leads to an increase in downconverted light emitted from the converter materials, such as via the Purcell effect, for example.

The electromagnetic, both optical electric and magnetic, fields inside the meta-molecule is designed to be enhanced at the absorption peak of the meta-molecule, which, as described, overlaps with the absorption peak of the converter. The meta-molecule may be designed with the converter meta-atoms spatially overlapped with the regions of high electromagnetic field enhancement. This increases the pump light absorption by the converter meta-atoms leading to an increase of the local photonic density of states and an increase in downconverted light emitted, as described above.

Tailoring of the emission properties of the meta-molecule enables control of the angular emission pattern (or directivity) of the light emitted by the converter material by coupling the converter material to optical antennas. By using gratings with hyperbolic media and hyper-crystals, the directivity of the emitted light may be tuned by tuning the properties of the meta-molecule. The meta-molecule may be designed to provide collimated light emission from the LED at multiple wavelengths.

The nano-structure 23 may also be fabricated as a layered material on top of the LED surface, such as on top of the GaN layer or on top of sapphire layer, using top-down fabrication techniques.

Figure 1D:
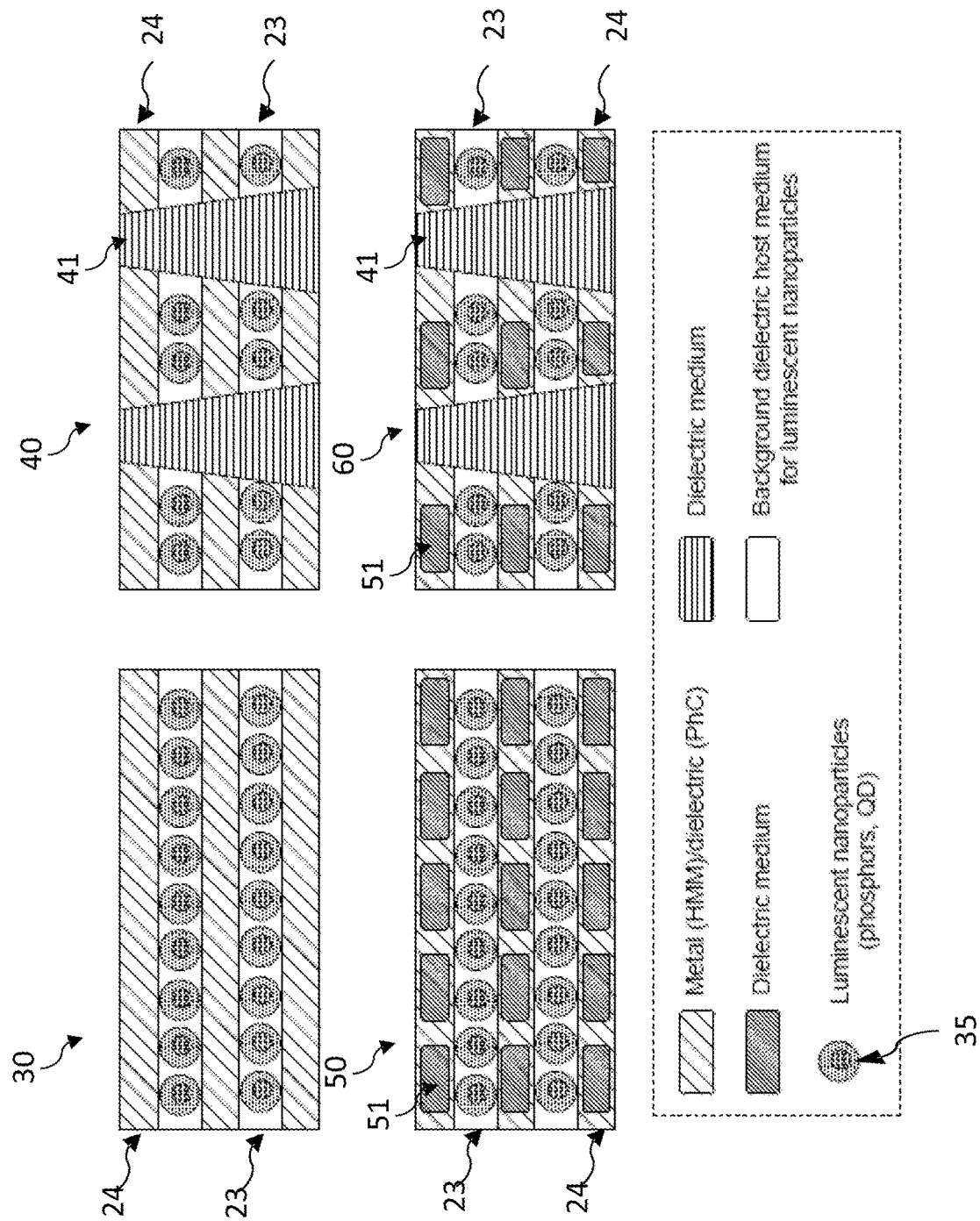
FIG. 1D illustrates configurations of the meta-molecule of FIG. 1C including exemplary combinations of metal/dielectric structures and converter particles.

FIG. 1D illustrates example configurations of the converter particles embedded in PhC and HMM as utilized in FIG. 1C. Depiction 30 of FIG. 1D illustrates alternating layers of nano-structure 23 and another layer 24 including a metal (HMM)/dielectric (PhC) to form a converter particle implementation. The nano-structure 23 may be any of the luminescent particles 35 discussed herein, including phosphors, QD, and the like. The converter nanoparticles 23 may be embedded within a host layer made up of dielectric materials. The another layer 24 may be formed with a metal, such as gold, in the form of an HMM, or a dielectric in the form of a PhC. Each unit cell of the PhC/HMM may be referred to as a meta-molecule. The PhC in depiction 30 may be referred to as a Distributed Bragg Reflector (DBR) since it is a PhC in one-dimension, although the present description may be utilized in multiple dimensions.

Depiction 40 builds on the converter particle implementation of depiction 30 by adding nano-patterning 41 to the meta-molecule. Again as illustrated and discussed above with respect to depiction 30, there are alternating layers of nano-structure 23 and another layer 24 including a metal (HMM)/dielectric (PhC) to form a converter particle implementation. The nano-structure 23 may be any of the luminescent particles 35 discussed herein, including phosphors, QD, and the like. The converter nanoparticles 23 may be embedded within a host layer made up of dielectric materials. The another layer 24 may be formed with a metal, such as gold, in the form of an HMM, or a dielectric in the form of a PhC. Depiction 40 illustrates holes and gaps 41 added to the converter particle implementation of depiction 30. These holes and gaps 41 may be formed from a dielectric material, for example. The holes and gaps 41 may improve the light extraction efficiency of the implementation. The holes and gaps 41 may incorporate a size and spacing that is approximately the size of the wavelength utilized or smaller. The pattern of the holes and gaps 41 need not be periodic, and may be one-dimensional or two dimensional.

Depiction 50 illustrates another implementation that builds on the implementation presented in depiction 30. Again as illustrated and discussed above with respect to depiction 30, there are alternating layers of nano-structure 23 and another layer 24 including a metal (HMM)/dielectric (PhC) to form a converter particle implementation. The nano-structure 23 may be any of the luminescent particles 35 discussed herein, including phosphors, QD, and the like. The converter nanoparticles 23 may be embedded within a host layer made up of dielectric materials. The another layer 24 may be formed with a metal, such as gold, in the form of an HMM, or a dielectric in the form of a PhC. In depiction 50, there is illustrated a two-dimensional PhC implementation of depiction 30 by incorporating additional dielectric inclusions 51. These additional dielectric inclusions 51 are provided in the metal layer or dielectric layer 24 described above with respect to depiction 30. The size and spacing of the inclusions 51 may be less than one-half the wavelength utilized.

The embodiment in depiction 60 illustrates an implementation of the converter particles embedded in PhC and HMM as per depiction 50 including the additional nano-patterning discussed with respect to depiction 40. As set forth with respect to depiction 50, there are alternating layers of nanostructures 23, i.e., particles, and another layer 24 including a metal (HMM)/dielectric (PhC) to form a converter particle implementation. The nano-structure 23 may be any of the luminescent particles 35 discussed herein, including phosphors, QD, and the like. The converter nanoparticles 23 may be embedded within a host layer made up of dielectric materials. The another layer 24 may be formed with a metal, such as gold, in the form of an HMM, or a dielectric in the form of a PhC. Additionally, there may be additional dielectric inclusions 51 included in the metal layer or dielectric layer 24.

Depiction 60 illustrates holes and gaps 41 added to the converter particle implementation of depiction 50. These holes and gaps 41 may be formed from a dielectric material, for example. The holes and gaps 41 may improve the light extraction efficiency of the implementation. The holes and gaps 41, size and spacing may be formed to be approximately the size of the wavelength utilized or smaller. The pattern of the holes and gaps 41 need not be periodic, and may be one-dimensional or two dimensional.

FIG. 1E illustrates a method 70 of interacting with the light of an LED using a meta-phosphor layer of FIGS. 1A-D. Method 70 includes providing power to an excitation layer of an LED to cause the LED to provide emitted light at step 71. Method 70 further includes interacting with the emitted light using a meta-molecule layer at step 72. The meta molecule may include at least one integrated downconverter including a plurality of nanoparticles and/or a photonic nanostructure. Method 70 may also include at least one of increasing the absorption of the blue pump light by increasing scattering in a converter layer at step 73, increasing the local photonic density of states to increase interaction of the layer with photons to increase down converted light at step 74, interacting with the emitted light to control the angular emission pattern of the emitted light into an optical far-field at step 75, and providing beamforming to direct the emitted light at step 76. FIG. 1E illustrates method 70. One of ordinary skill in the art would understand that more or less steps can be involved. Additionally, any of the steps may be combined to be performed at the same time. The order of these steps can also be altered such that any one or more of the steps are performed in a different sequence than illustrated in FIG. 1E.

The devices and method embodied in FIGS. 1A-E may be utilized in any or in conjunction with the devices and systems described below.

Figure 2A:
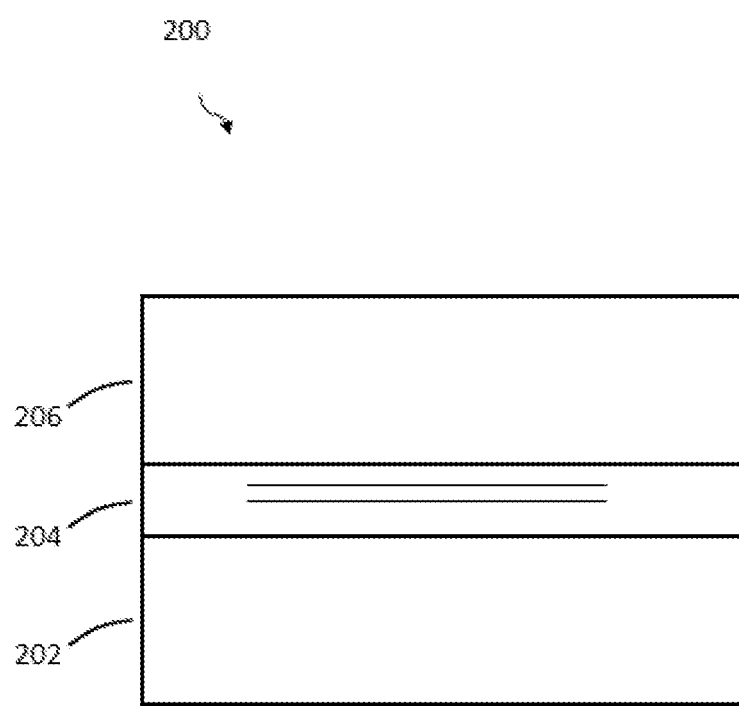
FIG. 2A is a diagram showing an LED device.

FIG. 2A is a diagram of an LED device 200 in an example embodiment. The LED device 200 may include one or more epitaxial layers 202, an active layer 204, and a substrate 206. In other embodiments, an LED device may include a wavelength converter layer and/or primary optics. As shown in FIG. 2A, the active layer 204 may be adjacent to the substrate 206 and emit light when excited. The epitaxial layers 202 may be proximal to the active layer 204 and/or one or more intermediate layers may be between the active layer 204 and epitaxial layers 202. The substrate 206 may be proximal to the active layer 204 and/or one or more intermediate layers may be between the active layer 204 and substrate 206. The active layer 204 emits light into the substrate 206.

Figure 2B:
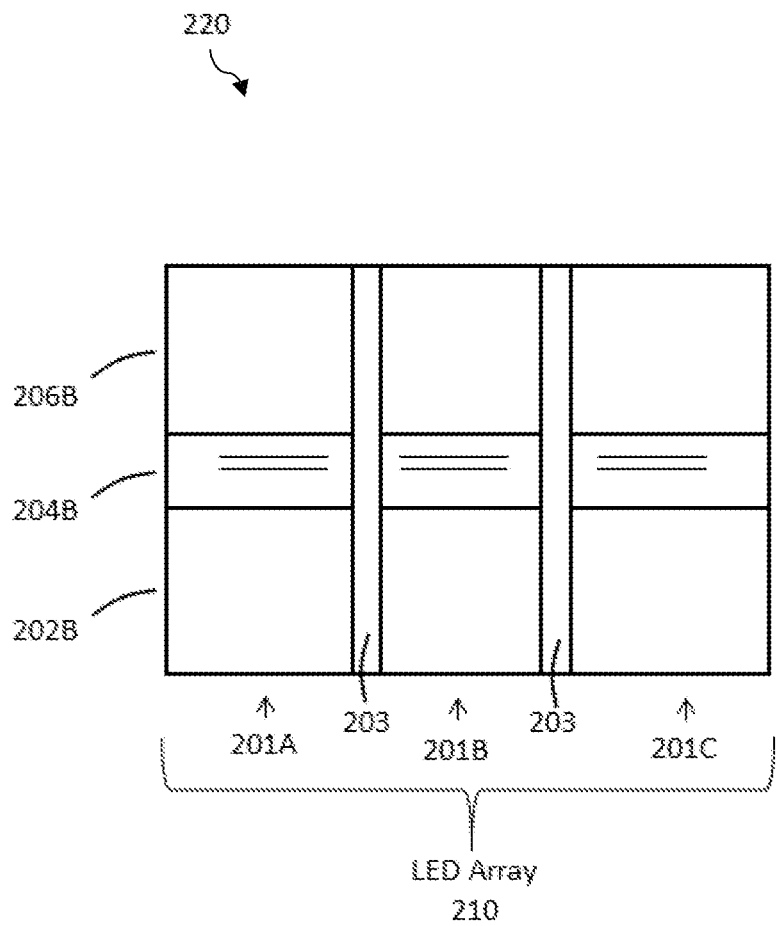
FIG. 2B is a diagram showing multiple LED devices.

FIG. 2B shows a cross-sectional view of a lighting system 220 including an LED array 210 with pixels 201A, 201B, and 201C. The LED array 210 includes pixels 201A, 201B, and 2010 each including a respective substrate 206B active layer 204B and an epitaxial layer 202B. Pixels 201A, 201B, and 201C, in the LED array 210 may be formed using array segmentation, or alternatively using pick and place techniques and may, for example, emit light at different peak wavelengths such as red, green, and blue. The spaces 203 shown between one or more pixels 201A, 201B, and 201C may include an air gap or may be filled by a material such as a metal material which may be a contact (e.g., n-contact). According to some embodiments, secondary optics such as one or more lenses and/or one or more waveguides may be provided.

The LED device 200 or pixels 201A, 201B, and 201C may be single wavelength emitters and may be powered individually or via as an array. The LED device 200 or pixels 201A, 201B, and 201C may be part of an illumination system that includes one or more electronics boards, power modules, sensors, connectivity and control modules, LED attach regions, or the like. Pixels in an array may be powered based on different channel signals and their operation may be determined by a microcontroller.

Figure 3:
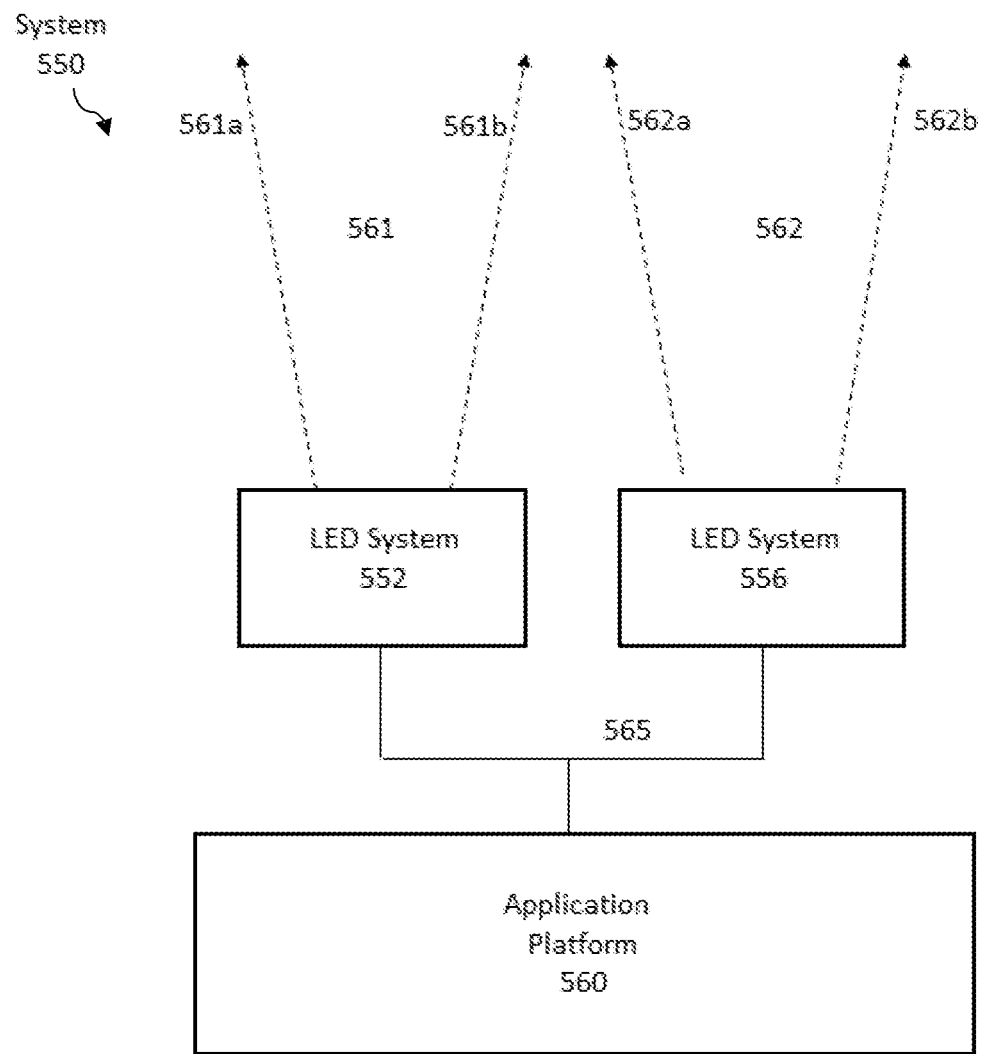
FIG. 3 is a diagram of an example application system.

FIG. 3 shows an example system 550 which includes an application platform 560 and LED systems 552 and 556. The LED System 552 produces light beams 561 shown between arrows 561a and 561b. The LED System 556 may produce light beams 562 between arrows 562a and 562b. As an example embodiment, the LED system 552 and 556 may be part of an automobile and may emit infrared (IR) light communication beams such that an oncoming vehicle in the path of the light beams 561 and/or 562 is able to receive communication from the automobile. In example embodiments, the system 550 may be a mobile phone of a camera flash system, indoor residential or commercial lighting, outdoor light such as street lighting, an automobile, a medical device, AR/VR devices, and robotic devices.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A device comprising:
   a light emitting diode (LED); and
   a meta-molecule wavelength converting layer positioned within an emitted light path from the LED, the meta-molecule wavelength converting layer including a plurality of meta-molecules, the meta-molecules comprising one or more nanoparticles and one or more converter nanoparticles such that:
   the one or more nanoparticles is a plurality of core-shell metal or dielectric nanoparticles each comprising a different material in a core than in a shell and the one or more converter nanoparticles is a converter nanoparticle, and the core-shell metal or dielectric nanoparticles surround the converter nanoparticle such that the core-shell metal or dielectric nanoparticles are resonance tuned with the converter nanoparticle; or the one or more nanoparticles is a core-shell metal or dielectric nanoparticle comprising a different material in the core than in the shell and the one or more converter nanoparticles is a plurality of converter nanoparticles, and the core-shell metal or dielectric nanoparticle is surrounded by the converter nanoparticles such that the core-shell metal or dielectric nanoparticle is resonance tuned with the converter nanoparticles; and the one or more nanoparticles are resonance tuned with the one or more converter nanoparticles such that they affect interaction of the one or more converter nanoparticles with one or both of light emitted by the LED and light emitted by the one or more converter nanoparticles.

2. The device of claim 1 wherein the one or more nanoparticles being resonance tuned to the one or more converter nanoparticles causes an absorption peak and an emission peak of the meta-molecules to overlap with an absorption peak and an emission peak of the one or more converter nanoparticles, and causes at least one of directing the light emitted by the one or more converter nanoparticles to be emitted in a specific direction, suppression of back-scattering by the one or more converter nanoparticles of the light emitted by the LED, and increase of an effective absorption cross-section of the one or more converter nanoparticle of light of a wavelength region.

3. The device of claim 1 wherein the one or more nanoparticles being resonance tuned to the one or more converter nanoparticles causes the one or more converter nanoparticle of light to increase scatter in a blue wavelength region and decrease scatter in a red wavelength region, orange wavelength region, yellow wavelength region, and green wavelength region.

4. The device of claim 1 wherein the one or more nanoparticles being resonance tuned to the one or more converter nanoparticles causes the meta-molecule converting layer to emit collimated light.

5. The device of claim 1 wherein the one or more nanoparticles and the one or more converter nanoparticles are each in direct contact with a same host dielectric medium.

6. The device of claim 1 wherein the one or more nanoparticles are arranged to suppress back-scatter of the light emitted by the LED caused by the one or more converter nanoparticles.

7. The device of claim 1 wherein the dielectric nanoparticles, the core-shell metal or dielectric nanoparticles, and the core-shell metal or dielectric nanoparticle each include at least one of silicon, silicon dioxide, titanium dioxide, and aluminum dioxide.

8. The device of claim 1 wherein the one or more converter nanoparticles are quantum wells.

9. The device of claim 1 wherein the one or more converter nanoparticles are nanowires of compound semiconductors.

10. The device of claim 1 wherein whichever one of the one or more nanoparticles and the one or more converter nanoparticles surrounds the other is in plural and regularly spaced from each other.

11. The device of claim 1 wherein the meta-molecules are not regularly spaced from each other.

12. The device of claim 1 wherein the one or more nanoparticles is the core-shell metal or dielectric nanoparticles, and at least two of the core-shell metal or dielectric nanoparticles have different shapes from each other.

13. The device of claim 1 wherein the one or more nanoparticles is the core-shell metal or dielectric nanoparticles, and at least two of the core-shell metal or dielectric nanoparticles surrounding the converter nanoparticle comprise different materials from each other in at least one of the core and the shell.

14. The device of claim 1 wherein the core of the core shell metal or dielectric nanoparticle is silica.

15. The device of claim 1 wherein the one or more nanoparticles is the core-shell metal or dielectric nanoparticle comprising a different material in the core than in the shell, and the one or more converter nanoparticles is the converter nanoparticles surrounding the core-shell metal or dielectric nanoparticles.

16. The device of claim 1 wherein the one or more nanoparticles is the core-shell metal or dielectric nanoparticles each comprising a different material in the core than in the shell, and the one or more converter nanoparticles is the converter nanoparticle surrounded by the core-shell metal or dielectric nanoparticles.

17. A device comprising:
a light emitting diode (LED); and
a meta-molecule wavelength converting layer positioned within an emitted light path from the LED, the meta-molecule wavelength converting layer including a plurality of meta-molecules, the meta-molecules comprising one or more nanoparticles and one or more converter nanoparticles such that:
the one or more nanoparticles is a plurality of dielectric nanoparticles and the one or more converter nanoparticles is a converter nanoparticle, and the dielectric nanoparticles surround the converter nanoparticle such that the dielectric nanoparticles are resonance tuned with the converter nanoparticle;
the one or more nanoparticles are resonance tuned with the one or more converter nanoparticles such that they affect interaction of the one or more converter nanoparticles with one or both of light emitted by the LED and light emitted by the one or more converter nanoparticle.

18. A device comprising:
a light emitting diode (LED); and
a meta-molecule wavelength converting layer positioned within an emitted light path from the LED, the meta-molecule wavelength converting layer including a plurality of meta-molecules, the meta-molecules comprising one or more nanoparticles and one or more converter nanoparticles such that:
the one or more nanoparticles is a dielectric nanoparticle and the one or more converter nanoparticles is a plurality of converter nanoparticles, and the dielectric nanoparticle is surrounded by the converter nanoparticles such that the dielectric nanoparticle is resonance tuned with the converter nanoparticles;
the one or more nanoparticles are resonance tuned with the one or more converter nanoparticles such that they affect interaction of the one or more converter nanoparticles with one or both of light emitted by the LED and light emitted by the one or more converter nanoparticles.

19. The device of claim 1 wherein the one or more nanoparticles comprises a core-shell metal or dielectric nanoparticle with a metal core and a dielectric shell.

20. The device of claim 1 wherein the one or more nanoparticles comprises a core-shell metal or dielectric nanoparticle with a dielectric core and a metal shell.

* * * * *